United States Patent [19]

Lorenzen et al.

[11] Patent Number: 4,553,928

[45] Date of Patent: * Nov. 19, 1985

[54] SWITCHING DEVICE FOR PHOTOFLASH UNIT

[75] Inventors: Steven C. Lorenzen, Charleston; Vaughn C. Sterling, Mattoon, both of Ill.

[73] Assignee: General Electric Company, Schenectady, N.Y.

[*] Notice: The portion of the term of this patent subsequent to Dec. 11, 2001 has been disclaimed.

[21] Appl. No.: 469,551

[22] Filed: Feb. 25, 1983

[51] Int. Cl.[4] .................. F21K 5/02; H01B 1/02; H01H 39/00

[52] U.S. Cl. ................... 431/359; 252/512; 252/514; 252/518; 338/15; 338/215; 362/6; 362/15

[58] Field of Search ............... 252/512, 514, 518; 431/359

[56] References Cited

U.S. PATENT DOCUMENTS

| | | | |
|---|---|---|---|
| 3,506,385 | 4/1970 | Weber | 431/95 |
| 3,990,833 | 11/1976 | Holub | 431/95 A |
| 4,045,712 | 8/1977 | DeTommasi | 252/518 |
| 4,064,431 | 12/1977 | Coté362 | 4/ |
| 4,299,558 | 10/1981 | Pinkasovick | 252/514 |
| 4,324,543 | 4/1982 | Broadt | 431/359 |
| 4,379,690 | 4/1983 | Kling et al. | 252/514 |
| 4,388,606 | 6/1983 | Shaffer et al. | 431/359 |
| 4,487,574 | 12/1984 | Jaffe | 431/359 |

Primary Examiner—Dennis L. Albrecht
Attorney, Agent, or Firm—J. F. McDevitt; Philip L. Schlamp; Fred Jacob

[57] ABSTRACT

An improved multiple flashlamp array is disclosed having a plurality of low voltage type lamps fired individually and in sequence by means of a plurality of static solid switching devices capable of reliable actuation by radiant energy generated during flashing of the lamps. Initially, these switching devices have a high electrical resistance ("off position") and after being actuated by the heat and light radiation, they undergo chemical conversion to an electrically conductive state ("on position"). The switch devices are prepared in a conventional manner from a particulate mixture of silver oxide with oxidized copper metal and which further contains a particular organic polymer binder mixture. The low voltage flashlamps being fired in this manner require that the converted switch devices exhibit an electrical resistance after conversion not to exceed about 0.3 ohms.

10 Claims, 3 Drawing Figures

४,५५३,९२८

SWITCHING DEVICE FOR PHOTOFLASH UNIT

RELATED APPLICATION

In U.S. patent application No. 451,505, filed Dec. 20, 1982 and U.S. Pat. No. 4,487,574, and assigned to the assignee of the present invention, there is described a photoflash lamp unit utilizing a radiant energy responsive switching device which operates in the same general manner as herein described. The chemical composition for said switching device is also generally similar to that for the present switching device which represents an improvement therein.

BACKGROUND OF THE INVENTION

Flashlamp units employing solid state switching devices to fire a plurality of flashlamps individually and in sequence are well-known. In U.S. Pat. No. 3,458,270 there is disclosed such a switching arrangement having switch devices of silver oxide adhesively bonded to the substrate of an electrical circuit with an organic polymer binder. The particular flashlamps employed are further depicted to be of the low voltage type which upon battery ignition convert the switch devices in the electrical circuit to a "low ohmic" condition. The organic binder in the switch material composition is said to produce a chain of reduction and oxidation reactions with the silver oxide which occurs simultaneously and exothermally in converting to a metallic silver state.

The conversion of silver oxide to metallic silver as a switching device in a photoflash unit is also well-known for use in the same manner with high voltage type flashlamps. For example, in a more recently issued U.S. Pat. No. 3,990,833, assigned to the assignee of the present invention, there is disclosed a switch material composition having silver oxide mixed with a carbon containing silver salt and a humidity resistant organic polymer binder which is converted by the radiant energy provided when a joining flashlamp is fired to metallic silver having a relatively low electrical resistance. The use of silver oxide as the sole silver source in the switching material composition is said to be objectionable for said type photoflash unit as being overly sensitive and proves to react too vigorously during conversion. That is, the silver oxide converts too vigorously and damages the circuitboard or the electrical circuit. Since the continuity of the electrical circuit to the next unfired flashlamp is also likely to be destroyed by such action, a carbon containing silver salt is mixed in the switch material composition to reduce this overall problem. In so doing, the electrical resistance of the converted switch is said to be in the range 0.1-10 ohms.

In the above referenced Ser. No. 451,505 application there is described a radiant energy responsive switch composition adapted for use in a low voltage firing circuit by exhibiting an electrical resistance not exceeding about 0.3 ohms after conversion. Said switch composition employs in weight percent approximately 51–72% silver oxide, approximately 20–36% powdered metal exhibiting thermal and electrical conductivity which does not react exothermally with silver oxide and approximately 8–13% organic polymer binder. In the preferred material composition, a composite organic polymer binder is employed wherein 3–6 weight percent of a first organic polymer binder, such as ethyl hydroxyethyl cellulose, serves as a fuel undergoing combustion for chemical reduction of the silver oxide component while a second organic polymer, such as black phenolic resin, makes up the remaining 5–7 weight percent to maintain continued adhesion of the converted switch to the circuitboard member. The preferred powdered metal in said switch composition is copper metal which is said to retain sufficient electrical resistance in the switching device before conversion to the electrically conductive state. The preferred method of applying said switch composition to the circuitboard is said to be silk screening from an organic liquid suspension whereby the material is deposited across a pair of spaced apart terminals in the electrical circuit.

Certain reliability problems have been experienced with the above described preferred switch composition due to some lack of operational sensitivity and storage stability of the liquid suspension during product manufacture. Only partial switch conversions have been experienced as the result of variable amounts of radiation being emitted from the associated flashlamps and which has further limited the product design by requiring close physical proximity of each switch to the actuating flashlamp. Moreover, a partially converted switch can produce higher circuit resistance leading to out of sequence flashing or failure of the flashlamps to flash. While increasing the proportion of copper metal powder in the switch composition was found to increase sensitivity of the switching device to a more complete conversion, such change also undesirably lowered the electrical resistance in the unconverted device below the minimum 1,000 volt level. Storage stability of the liquid switch suspension was found to be caused by partial solubility of the phenolic resin component in the organic solvent which produced viscosity variation leading to non-uniform switching devices being deposited therefrom as well as further loss in conversion sensitivity by coating the silver oxide particulates with a barrier layer.

A need still remains therefore for these switches to exhibit higher sensitivity in operation along with greater reliability in manufacture. Any modification of the switch material composition to accomplish these results must further remain stable under conditions of elevated temperature and high humidity by reason of experiencing such conditions during storage and use.

SUMMARY OF THE INVENTION

It is, therefore, an important object of the present invention to provide an improved photoflash unit using this type switching arrangement which is both converted more reliably and remains stable under conditions of manufacture as well as thereafter when the product is exposed to high temperature and high humidity. It has now been discovered that all of the foregoing objectives are achieved by modifying the previous switch material composition in a particular manner which further promotes chemical conversion of the silver oxide component. To promote said more complete conversion, the ratio of organic polymer binder serving as a fuel to the siler oxide does not exceed about 5:100 which precludes any quenching effect upon the thermochemical reaction. The level of the second organic polymer binder in said switch material composition is also reduced for the same purpose and a soluble thermoplastic polyhydroxyether substituted for the phenolic resin previously employed to avoid the other problems mentioned above which are caused with said binder. A still further critical change made in the presently improved switch material composition is replacement of the powdered copper metal component with a particular oxidized form of copper metal particulate. A useful oxidation treatment can be carried out with a simple air bake of said metal particulates at conditions producing an approximate six percent weight gain, such as by heating at 200° C. for about thirty minutes. This treatment increases the electrical resistance of the switching device before conversion to acceptable levels of 1000 ohms or greater while further enhancing switch sensitivity through lower electrical resistance after the switch has been converted to the conductive state. This latter surprising result can be achieved with oxidation of copper flake metal which further improves heat conduction within the switch device as compared with even oxidized copper metal powder in order to help propogate the thermochemical conversion of silver oxide.

A suitable radiant energy responsive switch material composition satisfying all of the foregoing objectives comprises in weight percent approximately 55-65% silver oxide, approximately 20-30% oxidized copper metal particulates, approximately 1-3% of an organic polymer binder serving as a fuel during conversion of the silver oxide, and approximately 1-3% of a soluble thermoplastic polyhydroxyether polymer binder. Up to about 2% by weight of a conversion inhibitor for the silver oxide such as benzotriazole or a commercial waterproofing agent such as Reomet #38 is also added optionally to the switch material composition for improved humidity resistance after the switching devices have been deposited on the circuitboard. In applying switches to the circuitboard between the electrical terminals, conventional coating techniques may be used which require the presence of an organic diluent or solvent. A particularly useful solvent commercially available is butyl cellosolve acetate which entirely dissolves the preferred polyhydroxyether binder component being used and which is sold by Union Carbide as PKHC phenoxy resin. The material for deposition is formed by mixing the switch material components together with the solvent to form a slurry. This may be applied across the terminals for each switch by conventional means such as a thin coating preferably by silk screening techniques.

DESCRIPTION OF THE PREFERRED EMBODIMENTS

Figure 1:
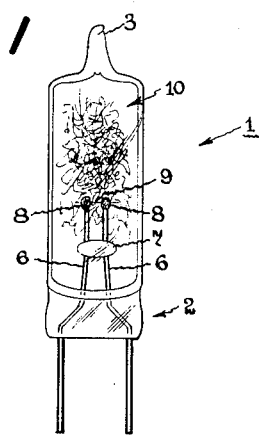
FIG. 1 is an elevation view of a prior art photoflash lamp of the all-glass type which can be used in a photoflash unit according to the present invention.

Referring now to FIG. 1, there is shown a representative all-glass type flashlamp of the prior art such as more fully disclosed in U.S. Pat. Nos. 2,982,119; 3,188,162; or 3,304,750, all assigned to the assignee of the present invention. The lamp comprises a tubular glass wall indicated at 1 with said wall forming part of the hermetically sealed envelope enclosing the operating parts of the lamp. The stem press base, indicated at 2, seals one end of the lamp and provides electrical contact means and handling means while an exhaust tip 3 has been provided and closed at the other end of the lamp. The inlead wires 6 pass through the stem press base 2 and are preferably joined by a glass bead 7 within the lamp envelope which holds them rigidly. The inner ends of the inleads are coated with a photoflash primer 8 and have an electrical filament 9 connecting them to provide the ignition means for said lamp. A filling of filamentary combustible material 10 is provided within the lamp envelope along with a combustion supporting atmosphere, such as oxygen, at above atmospheric pressure to provide the source of lamp illumination when actuated with an electrical firing pulse, from a low voltage firing circuit, of about 4 volts intensity.

Figure 2:
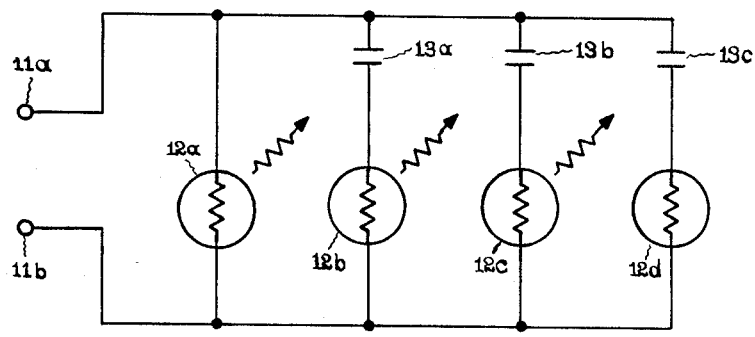
FIG. 2 is an electrical schematic diagram of a preferred firing circuit embodying improved switching devices of the present invention.

In FIG. 2, a plurality of said electrically fired photoflash lamps 12a, 12b, 12c and 12d are provided in a flashlamp unit which is provided with a pair of electrical terminals 11a and 11b for connection respectively to a conventional source of low voltage such as a battery (not shown). The circuit terminal 11b is connected electrically to a lead-in wire of each of the flashlamps 12a through 12d. The circuit terminal 11a is connected electrically to the other lead-in wire of lamp 12a. Normally open radiation switches 13a, 13b and 13c are respectively connected in electrical series between the other lead-in wires of lamps 12b, 12c and 12d and the circuit terminal 11a, and are respectively positioned sufficiently near the lamps 12a, 12b and 12c to receive sufficient light and/or heat radiation therefrom when flashed so as to become converted to the low resistance or on condition thereby connecting the array terminal 11a to the next lamp to be flashed. The lamps are open circuits or have a high impedance across their lead-in wires after flashing.

Figure 3:
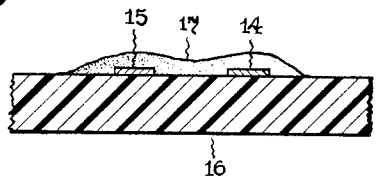
FIG. 3 is a cross-sectional view through a single switch device and the connecting terminals for a circuitboard member utilizing the schematic circuit depicted in FIG. 2.

FIG. 3 shows an enlarged cross-section of a typical switch device which can be employed in the above described lamp firing circuit. More particularly, a switch terminal pair 14 and 15 are mounted on circuitboard member 16. Said radiation switch 17 is applied to the circuitboard 16 as a coating in electrical contact with the terminals 14 and 15. Accordingly, each radiation switch upon receiving heat and/or light radiation from the adjacent lamp when it is flashed, changes from an open circuit of high resistance to a closed circuit of low resistance, thereby electrically connecting the switch terminals embedded therein so as to enable flashing of the next lamp in the sequence.

The present improvement resides in discovery that a suitable material for preparing said radiation switches has the above defined switch material composition in order to more reliably convert when exposed to the heat radiated from the lamp to a low electrical resistance in the approximate range 0.03-0.3 ohms and which does not convert spuriously or with such vigorous action to produce a discontinuity in the associated electrical circuit. Accordingly, it is required that no "blow-off" of the switch device takes place during its thermochemical conversion and that the converted mass of silver metal remains adhesively bonded to the support member for the electrical circuit. An especially preferred switch material composition exhibiting all the foregoing desired characteristics comprises in weight percent 65% silver oxide, 29% oxidized copper flake, 2.6 ethyl hydroxyethyl cellulose, 2.9% polyhydroxyether resin, and 0.5% conversion inhibitor. For added humidity resistance of the deposited switch device, it is also preferred to rinse the silver oxide used in said switch material with a liquid solution of the selected conversion inhibitor.

To still further demonstrate the nature and extent of the present improvement with respect to the desired sensitivity of switch operation, circuitboard members utilizing the general electrical circuit and switch device pattern described above in connection with FIGS. 2-3 were tested. The test evaluation compared the incidence of lamp failure to flash in the desired sequence between the above described preferred switch composition and the commercial embodiment of a switch composition made in accordance with the aforementioned U.S. Pat. No. 4,487,574. The particular photoflash lamp units tested in this manner each included paired low voltage type flashlamps, an electrical circuit into which said lamps are arranged to fire individually and in sequence, with the switching devices being located external of the lamps and forming part of the electrical circuit, said switching devices being located adjacent said lamps and disposed to receive radiant energy emitted from said adjacent lamps, and said photoflash lamp unit being further characterized by the flashlamps being actuated with a 4 volt firing pulse. An average 0.55% defect rate was experienced whereby the commercial switch devices only partially converted as compared with no defects attributable to partial conversion being experienced for the presently improved switch composition. Still further tests were conducted demonstrating the increased conversion sensitivity realized in accordance with the present invention. Specifically, when the test switches were actuated with approximately 50% of the radiant energy being removed from the actuating flashlamps by optical filtering means, it was found that the electrical resistance across the present switching devices after conversion was considerably lower than measured upon the converted commercial switching devices.

It will be apparent from the foregoing description that various modifications may be made in the above disclosed photoflash unit embodiments without departing from the true spirit and scope of the invention. For example it is not essential that the switch devices be deposited directly on the printed circuitboard or operated only in conjunction with the number or type of flashlamps specifically disclosed. It is intended to limit the present invention, therefore, only by the scope of the following claims.

What we claim as new and desire to secure by Letters Patent of the United States is:

1. A radiant energy responsive switch composition suitable for a photoflash lamp unit which employs a low-voltage electrical circuit comprising in weight percent approximately 55-65% silver oxide, approximately 20-30% oxidized copper metal particulates, approximately 1-3% of an organic polymer binder serving as a fuel during conversion of the silver oxide, and approximately 1-3% of a soluble thermoplastic polyhydroxyether polymer binder serving to provide adhesive bonding action for said switch composition after conversion of the silver oxide takes place, the ratio of organic polymer binder serving as a fuel to the silver oxide not exceeding about 5:100.

2. A switch composition as in claim 1 wherein the ratio of organic polymer binder serving as a fuel to the silver oxide does not exceed about 5:100.

3. A switch composition as in claim 1 wherein the organic polymer binder serving as a fuel is ethyl hydroxyethyl cellulose.

4. A switch composition as in claim 1 wherein the oxidized copper metal particulates are in flake form.

5. A switch composition as in claim 1 wherein the electrical resistivity after conversion does not exceed about 0.3 ohms.

6. A switch composition as in claim 1 which further contains up to about 2% by weight of a conversion inhibitor for the silver oxide.

7. An improved photoflash lamp unit comprising:
    (a) a pair of low voltage type flashlamps,
    (b) an electrical circuit into which said lamps are arranged to fire individually and in sequence, and
    (c) a solid state radiant energy switching device located external of the lamps and forming part of the electrical circuit, said switching device being located adjacent one of said lamps and disposed to receive radiant energy emitted by that lamp, wherein the improvement comprises a switch composition comprising in weight percent approximately 55-65% silver oxide, approximately 20-30% oxidized copper metal particulates, approximately 1-3% of an organic polymer binder serving as a fuel during conversion of the silver oxide, and approximately 1-3% of a soluble thermoplastic polyhydroxyether polymer binder serving to provide adhesive bonding action for said switch composition after conversion of the silver oxide takes place, the ratio of organic polymer binder serving as a fuel to the silver oxide not exceeding about 5:100.

8. The photoflash unit of claim 7 wherein the ratio of organic polymer binder serving as a fuel to the silver oxide does not exceed about 5:100.

9. The photoflash unit of claim 7 wherein said switching device extends between and contacts a pair of terminals in said electrical circuit.

10. The photoflash unit of claim 7 wherein said flashlamps each comprise a hermetically sealed transparent envelope containing ignition means, a combustion supporting atmosphere at above atmospheric pressure, and filamentary combustible material.

* * * * *